(12) United States Patent
Chen et al.

(10) Patent No.: US 10,332,856 B2
(45) Date of Patent: Jun. 25, 2019

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Wei-Chih Chen, Taipei (TW);
Hung-Jui Kuo, Hsinchu (TW);
Yu-Hsiang Hu, Hsinchu (TW);
Sih-Hao Liao, New Taipei (TW);
Po-Han Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/806,347

(22) Filed: Nov. 8, 2017

(65) Prior Publication Data

US 2019/0139924 A1 May 9, 2019

(51) Int. Cl.

| H01L 25/11 | (2006.01) |
|---|---|
| H01L 23/00 | (2006.01) |
| H01L 25/04 | (2014.01) |
| H01L 25/07 | (2006.01) |
| H01L 25/075 | (2006.01) |
| H01L 25/065 | (2006.01) |

(52) U.S. Cl.
CPC .............. *H01L 24/24* (2013.01); *H01L 24/25* (2013.01); *H01L 24/73* (2013.01); *H01L 24/82* (2013.01); *H01L 25/042* (2013.01); *H01L 25/0655* (2013.01); *H01L 25/072* (2013.01); *H01L 25/0753* (2013.01); *H01L 25/115* (2013.01); *H01L 2224/2402* (2013.01); *H01L 2224/2499* (2013.01); *H01L 2224/24101* (2013.01); *H01L 2224/24137* (2013.01); *H01L 2224/25171* (2013.01); *H01L 2224/73209* (2013.01); *H01L 2224/82007* (2013.01); *H01L 2224/82106* (2013.01)

(58) Field of Classification Search
CPC ............... H01L 25/115; H01L 25/0655; H01L 25/0753; H01L 25/072; H01L 25/042
See application file for complete search history.

(56) References Cited

U.S. PATENT DOCUMENTS

| 2014/0091454 | A1* | 4/2014 | Lin ........................ H01L 24/19 257/734 |
| 2017/0170124 | A1* | 6/2017 | Huang .................. H01L 21/565 |

* cited by examiner

*Primary Examiner* — Selim U Ahmed
*Assistant Examiner* — Evan G Clinton
(74) *Attorney, Agent, or Firm* — JCIPRNET

(57) ABSTRACT

A package structure including at least one semiconductor die, an insulating encapsulant, an insulating layer, conductive pillars, a dummy pillar, a first seed layer and a redistribution layer is provided. The semiconductor die have a first surface and a second surface opposite to the first surface. The insulating encapsulant is encapsulating the semiconductor die. The insulating layer is disposed on the first surface of the semiconductor die and on the insulating encapsulant. The conductive pillars are located on the semiconductor die. The dummy pillar is located on the insulating encapsulant. The first seed layer is embedded in the insulating layer, wherein the first seed layer is located in between the conductive pillars and the semiconductor die, and located in between the dummy pillar and the insulating encapsulant. The redistribution layer is disposed over the insulating layer and is electrically connected to the semiconductor die through the conductive pillars.

20 Claims, 6 Drawing Sheets

PACKAGE STRUCTURE AND METHOD OF FABRICATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
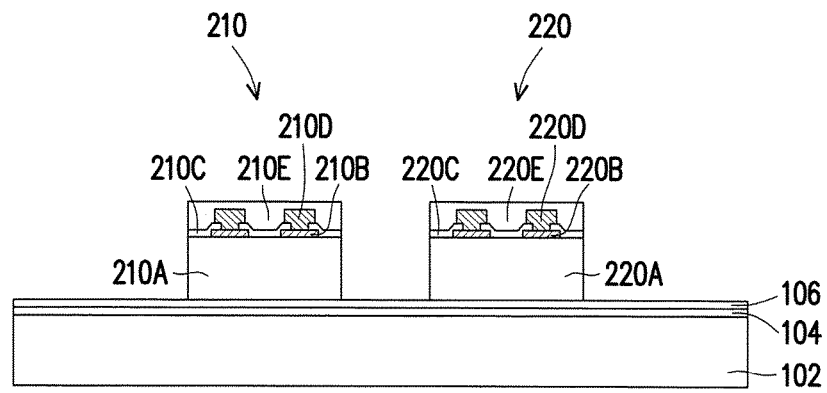
FIG. 1 to FIG. 8 are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 8 are schematic sectional views of various stages in a method of fabricating a package structure according to some exemplary embodiments of the present disclosure. As shown in FIG. 1, a carrier 102 including a debond layer 104 and a buffer layer 106 coated thereon is provided. The carrier 102 may be a glass carrier or any suitable carrier for carrying a semiconductor wafer or a reconstituted wafer used for the method of fabricating the package structure. In some embodiments, the debond layer 104 may include a release layer (such as a light-to-heat conversion ("LTHC") layer) and an adhesive layer (such as an ultra-violet curable adhesive or a heat curable adhesive layer). In some embodiments, the buffer layer 106 may be a dielectric material layer. In some embodiments, the buffer layer 106 may be a polymer layer which is made of polyimide, polybenzoxazole (PBO), benzocyclobutene (BCB), or any other suitable polymer-based dielectric material. The debond layer 104 and the buffer layer 106 may be formed by a suitable fabrication technique such as spin-coating, lamination, deposition, or the like. However, the materials of the carrier 102, the debond layer 104 and the buffer layer 106 are not limited to the descriptions of the embodiments. In some alternative embodiments, the buffer layer 106 may be omitted; in other words, merely the debond layer 104 is formed over the carrier 102.

In the exemplary embodiment, after forming the debond layer 104 and the buffer layer 106, a first semiconductor die 210 and a second semiconductor die 220 is bonded onto the carrier 102. In some embodiments, the first semiconductor die 210 and the second semiconductor die may be picked and placed on the buffer layer 106. Although only two semiconductor dies (210 and 220) are shown in FIG. 1, however, the number of semiconductor dies are not limited thereto, and this can be adjusted based on requirement. In some embodiments, the first semiconductor die 210A and the second semiconductor 220A are the same type of semiconductor dies. In some other embodiments, the first semiconductor die 210A and the second semiconductor die 220A are different types of dies. In certain embodiments, the first semiconductor die 210A and the second semiconductor die 220A can be any one of a system-on-chip (SoC) device, a memory device, a radio frequency device or any other suitable types of devices.

In the embodiment, the first semiconductor die 210 may, for example, includes a semiconductor substrate 210A, a plurality of conductive pads 210B, a passivation layer 210C, a plurality of conductive posts 210D and a protection layer 210E. Similarly, the second semiconductor die 220, may, for example, includes a semiconductor substrate 220A, a plurality of conductive pads 220B, a passivation layer 220C, a plurality of conductive posts 220D and a protection layer 220E. In some embodiments, referring to the first semiconductor die 210 and the second semiconductor die 220, the plurality of conductive pads 210B and 220B are formed on the semiconductor substrates 210A and 220A respectively, and the passivation layers 210C and 220C are formed on the semiconductor substrate 210A and 220A and have openings that partially expose the conductive pads 210B and 220B. In some embodiments, the semiconductor substrates 210A and 220A are silicon substrates including active components (e.g., transistors, diodes, optoelectronic devices or the like) and passive components (e.g., resistors, capacitors, inductors, transducers or the like) formed therein. In certain embodiments, the conductive pads 210B and 220B are aluminum pads, copper pads or other suitable metallic pads. In some embodiments, the passivation layers 210C and 220C includes a silicon oxide layer, a silicon nitride layer, a silicon oxy-nitride layer or a dielectric layer formed by other suitable dielectric materials.

Furthermore, in some embodiments, the conductive posts 210D and 220D are formed on the exposed conductive pads 210B and 220B respectively, and the protection layers 210E and 220E are formed on the passivation layers 210C and 220C covering the conductive posts 210D and 220D. In some embodiments, the conductive posts 210D and 220D are formed on the conductive pads 210B and 220B by plating. In some embodiments, the conductive posts 210D and 220D are copper pillars or copper alloy pillars. In certain embodiments, the protection layers 210E and 220E includes a polymer layer having sufficient thickness to protect the conductive posts 210D and 220D. For example, the protection layers 210E and 220E includes a polybenzoxazole (PBO) layer, a polyimide (PI) layer or layers of other suitable polymer materials. In some alternative embodiments, the protection layers 210E and 220E may be made of inorganic materials. In some other embodiments, the protection layers 210E and 220E can be made of epoxy molding compound (EMC). In certain embodiments, the protection layers 210E and 220E may be omitted. That is to say, the protection layers 210E and 220E of the first and second semiconductor dies 210 and 220 may exist or not based on requirements.

In the exemplary embodiment, the first semiconductor die 210 and the second semiconductor die 220 are placed on the buffer layer 106, and the first and second semiconductor dies 210 and 220 are attached (or adhered) to the buffer layer 106 through a die attach film (not shown). In some alternative embodiments, the first and second semiconductor dies 210 and 220 placed on the buffer layer 106 may be arranged in arrays. In some embodiments, a plurality of through insulator vias (not shown) may be optionally formed on the buffer layer 106 before placing the semiconductor dies (210/220), if further connection is needed for the backside of the package or double-sided connection is required based on the product design. It is understood that the disclosure is not limited by the examples provided herein.

Figure 2:
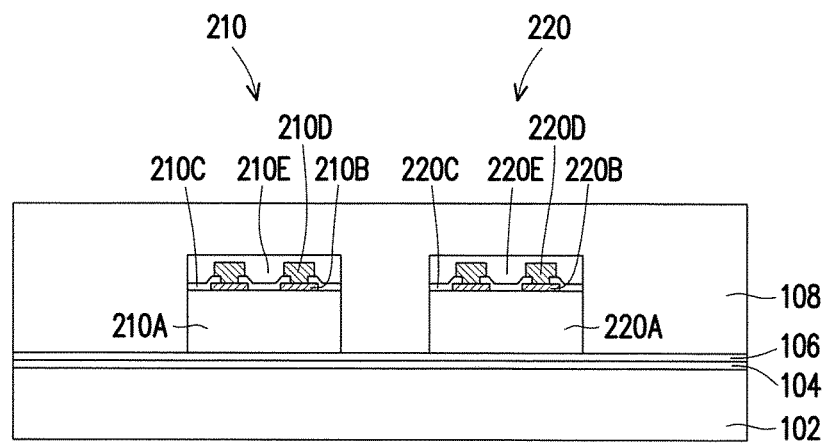

Referring to FIG. 2, after bonding the first semiconductor die 210 and the second semiconductor die 220 on the carrier 102, an insulating material 108 is formed on the buffer layer 106 and over the semiconductor dies (210/220). In some embodiments, the insulating material 108 is formed through, for example, a compression molding process, filling up the gaps between the first semiconductor die 210 and the second semiconductor die 220. In certain embodiments, the insulating material 108 for example encapsulates the first semiconductor die 210 and the second semiconductor die 220. At this stage, the conductive posts (210D/220D) and the protection layers (210E/220E) of the first and second semiconductor dies 210 and 220 are encapsulated and well protected by the insulating material 108. In other words, the conductive posts (210D/220D) and the protection layers (210E/220E) of the first and second semiconductor dies 210 and 220 are not revealed and are well protected by the insulating material 108. In some embodiments, the insulating material 108 includes epoxy resins or other suitable resins. In some embodiments, the insulating material 108 has low permittivity (Dk) and low loss tangent (Df) properties. In some embodiments, filler particles (not shown) may be included in the insulating material 108, whereas the filler particles may be dielectric particles of $SiO_2$, $Al_2O_3$, silica, or the like.

Figure 3:
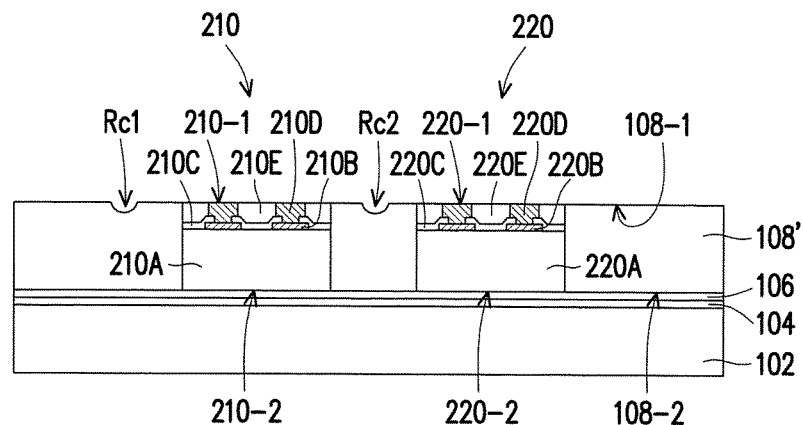

Referring to FIG. 3, the insulating material 108 is partially removed to expose the conductive posts 210D and 220D of the first and second semiconductor dies 210 and 220. In some embodiments, the insulating material 108 and the protection layers 210E and 220E are ground or polished by a mechanical grinding process and/or a chemical mechanical polishing (CMP) process until the top surfaces of the conductive posts 210D and 220D. The insulating material 108 may be polished to form an insulating encapsulant 108'. In some embodiments, after grinding and polishing, the first semiconductor die 210 may have a first surface 210-1 and a second surface 210-2 opposite to the first surface 210-1, and the second semiconductor die 220 may have a first surface 220-1 and a second surface 220-2 opposite to the first surface 220-1, wherein a upper surface 108-1 of the insulating encapsulant 108' is substantially coplanar and leveled with the first surfaces (210-1 and 220-1) of the first and second semiconductor dies 210 and 220, and a lower surface 108-2 of the insulating encapsulant 108' is substantially coplanar and leveled with the second surfaces (210-2 and 220-2) of the first and second semiconductor dies 210 and 220. In some embodiments, after grinding and polishing, at least one recess (Rc1/Rc2) may be formed on the upper surface 108-1 of the insulating encapsulant 108'. For example, a first recess Rc1 is formed on the upper surface 108-1 of the insulating encapsulant 108' adjacent to the first surface 210-1 of the first semiconductor die 210, and a second recess Rc2 is formed on the upper surface 108-1 of the insulating encapsulant 108' adjacent to the first surface 220-1 of the second semiconductor die 210. In some other embodiments, recesses are randomly formed on the upper surface 108-1 of the insulating encapsulant 108'.

Figure 4:
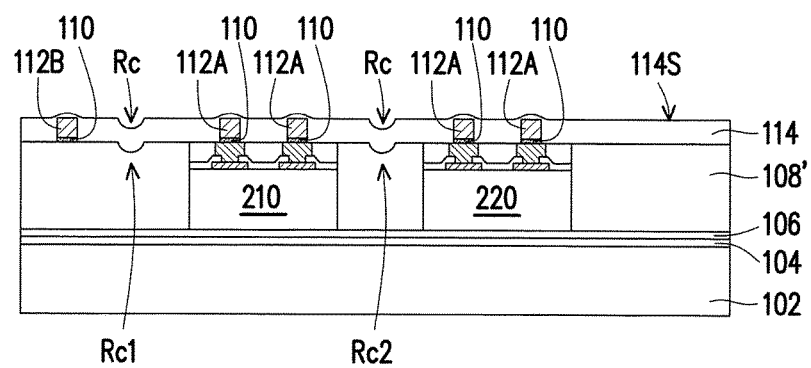
Figure 5A:
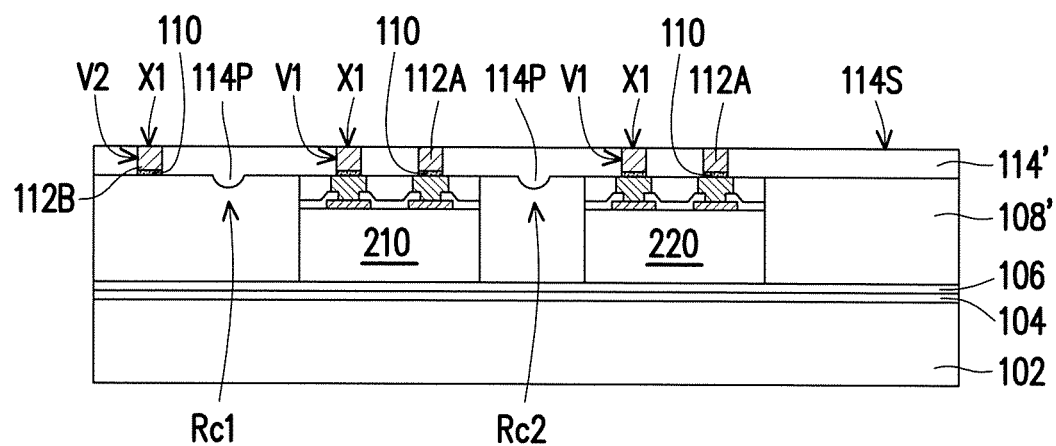
Figure 5B:
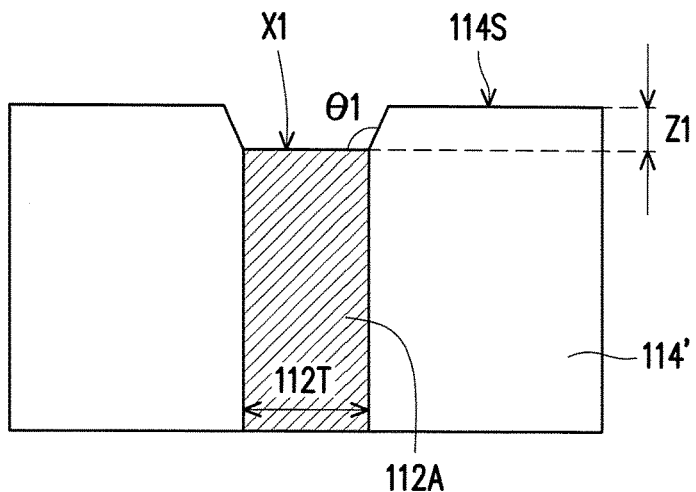
Figure 5C:
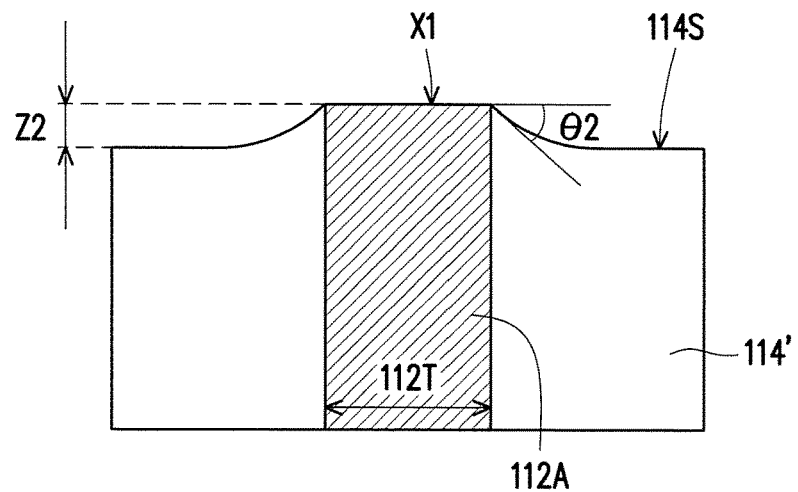

Referring to FIG. 4, a first seed layer 110 (patterned first seed layer), a plurality of conductive pillars 112A, at least one dummy pillar 112B are formed on the insulating encapsulant 108', and on the first semiconductor die 210 and the second semiconductor die 220. In some embodiments, the first seed layer 110, the plurality of conductive pillars 112A and the dummy pillar 112B are formed by the following steps. For example, a seed layer (not shown) is first formed on the insulating encapsulant 108' covering the first and second semiconductor dies 210 and 220 and covering the first and second recesses Rc1 and Rc2. A photoresist pattern (not shown) is provided on the seed layer, wherein the photoresist pattern has openings exposing surfaces of the seed layer. Subsequently, the plurality of conductive pillars 112A and the dummy pillars 112B are formed within the openings to cover the exposed surfaces of the seed layer. In a next step, the photoresist pattern and portions of the seed layer below the photoresist pattern may be removed to form the first seed layer 110 (patterned first seed layer). That is, the portions of the seed layer below the plurality of conductive pillars 112A and below the dummy pillars 112B are retained to form the first seed layer 110. After forming the first seed layer 110 having the conductive pillars 112A and dummy pillar 112B formed thereon, an insulating layer 114 (polymeric insulating layer) may be formed to conformally cover the conductive pillars 112A, the dummy pillars 112B and the first and second recesses Rc1 and Rc2. In some embodiments, the insulating layer 114 may have recesses Rc on a top surface 114S of the insulating layer 114, wherein the recesses Rc corresponds to a position where the first and second recesses Rc1 and Rc2 are formed. In certain embodiments, the material of the insulating layer 114 includes polyimide, epoxy resin, acrylic resin, phenol resin, benzocyclobutene (BCB), polybenzooxazole (PBO), or any other suitable polymer-based materials Subsequently, referring to FIG. 5A, the insulating layer 114, the conductive pillars 112A and the dummy pillar 112B are ground or polished by a fly cutting process, and/or a chemical mechanical polishing (CMP) process to reveal the top surfaces X1 of the conductive pillars 112A and the dummy pillar 112B. In some embodiments, the recesses Rc on the top surface 114S of the insulating layer 114 are removed by grinding and polishing. In some embodiments, after grinding and polishing, the top surface 114S of the polished insulating layer 114' is substantially coplanar and leveled with the top surfaces X1 of the conductive pillars 112A and the dummy pillar 112B. Depending on a thickness of the conductive pillars 112A, the resulting insulating layer 114' may have a top surface 114S that is located slightly higher or slightly lower than the top surfaces X1 of the conductive pillars 112A and dummy pillar 112B. For example, as shown in FIG. 5B, in some embodiments, when the conductive pillars 112A have a thickness 112T of less than 2 µm, the top surface 114S of the insulating layer 114' may be at a position slightly higher than the top surface X1 of the conductive pillars 112A. In such embodiment, a height difference Z1 between the top surface X1 of the conductive pillars 112A and the top surface 114S of the insulating layer 114' may be in a range of 0.1 µm to 0.2 µm, and an angle θ1 of the top surface X1 of the conductive pillars 112A relative to the insulating layer 114' is in a range of 115° to 180°. In another embodiment, as shown in FIG. 5C, for example, when the conductive pillars 112A have a thickness 112T of greater than 7 µm, the top surface 114S of the insulating layer 114' may be at a position slightly lower than the top surface X1 of the conductive pillars 112A. In such embodiment, a height difference Z2 between the top surface X1 of the conductive pillars 112A and the top surface 114S of the insulating layer 114' may be in a range of 0.1 µm to 0.2 µm, and an angle θ2 of the top surface X1 of the conductive pillars 112A relative to the top surface 114S of the insulating layer 114' is in a range of 0° to 20°. In some other embodiments, when the conductive pillars 112A have a thickness 112T in the range of 2 µm to 7 µm, the height difference between the top surface X1 of the conductive pillars 112A and the top surface 114S of the insulating layer 114' is smaller than 0.1 µm or nearly zero.

Referring back to FIG. 5A, in some embodiments, after grinding and polishing, the conductive pillars 112A are located on the first semiconductor die 210 and the second semiconductor die 220 and inlaid in the insulating layer 114'. In some embodiments, the dummy pillar 112B is located on the insulating encapsulant 108' and inlaid in the insulating layer 114'. Furthermore, in the exemplary embodiment, the first seed layer 110 is embedded within the insulating layer 114', wherein the first seed layer 110 is located in between the plurality of conductive pillars 112A and the first and second semiconductor dies 210 and 220. In some embodiments, the first seed layer 110 is further located in between the at least one dummy pillar 112B and the insulating encapsulant 108'. In some embodiments, the conductive pillars 112A are filled or inlaid in first vias V1 of the insulating layer 114', whereas the dummy pillar 112B is filled or inlaid in second via V2 of the insulating layer 114'. Furthermore, the first vias V1 are for example located at a position corresponding to the conductive posts 210D and 220D of the first and second semiconductor dies 210 and 220, whereas the second via V2 are located at a position above the insulating encapsulant 108'. In addition, in some embodiments, the insulating layer 114' (polymeric insulating layer) have protruded portions 114P that are located in and filling up the first recess Rc1 and the second recess Rc2 located on the upper surface 108-1 of the insulating encapsulant 108'.

Figure 6A:
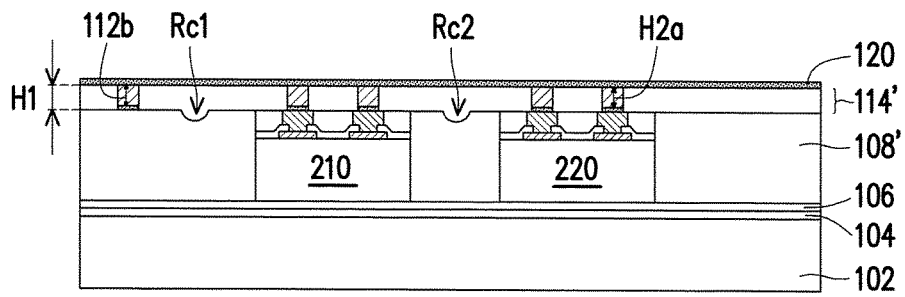
Figure 6B:
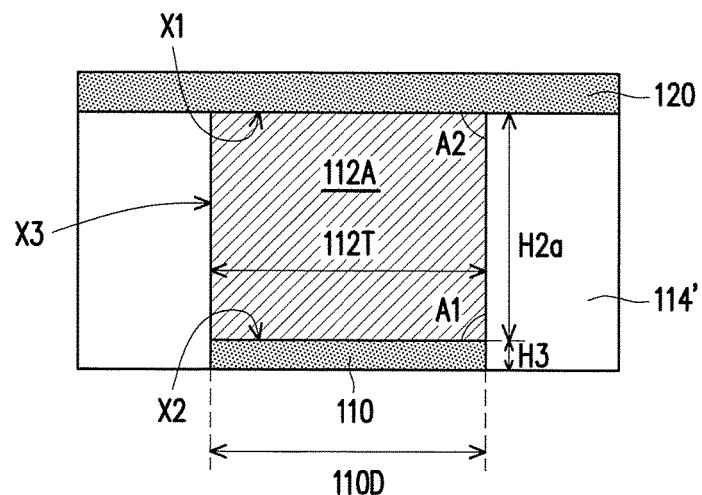

Referring to FIG. 6A, after grinding and polishing, a second seed layer 120 is formed on the insulating layer 114' and covering the plurality of conductive pillars 112A and the dummy pillar 112B. In some embodiments, the conductive pillars 112A physically separates the first seed layer 110 from the second seed layer 120. Similarly, in some embodiments, the dummy pillars 112B physically separates the first seed layer 110 from the second seed layer 120. That is, the first seed layer 110 is not in contact with the second seed layer 120. From an enlarged view of the conducive pillar 112A as shown in FIG. 6B, the conductive pillars 112A have a top surface X1, a bottom surface X2 opposite to the top surface X1, and side surfaces X3 joining the top surface X1 to the bottom surface X2, and a width of the top surface X1 is substantially equal to a width of the bottom surface X2. That is, the conductive pillars 112A have a width 112T that is kept substantially equal from the top surface X1 to the bottom surface X2. In some embodiments, the bottom surface X2 of the conductive pillars 112A is in contact with the first seed layer 110, and a width 112T of the bottom surface X2 of the conductive pillars is substantially equal to a width 110D of the first seed layer 110. In certain embodiments, an angle A2 of the bottom surface X2 relative to the side surfaces X3 of the plurality of conductive pillars 112A is 88° to 95°, and an angle A1 of the top surface X1 relative to the side surfaces X3 of the plurality of conductive pillars 112A is 88° to 95°. Furthermore, in some embodiments, a shape of the dummy pillar 112B is the same as a shape of the plurality of conductive pillars 112A. That is, the dummy pillar 112B may have the same widths and angles as described above for the conductive pillars 112A. In some embodiments, a height of the conductive pillars 112A is in a range from 8 µm to 10 µm before the grinding and polishing steps shown in FIG. 4. In certain embodiments, a height H2a of the conductive pillars 112A is in a range from 4 µm to 6 µm after the grinding and polishing steps shown in FIG. 5A. That is to say, the final height of the conductive pillars 112A may be 4 µm to 6 µm. Similarly, in some embodiments, a height H2b of the dummy pillar 112B is in a range from 4 µm to 6 µm after the grinding and polishing steps. In certain embodiments, a height H1 of the insulating layer 114' is equal to a sum of heights (H2a+H3) of the conductive pillars 112A and the first seed layer 110.

Figure 7:
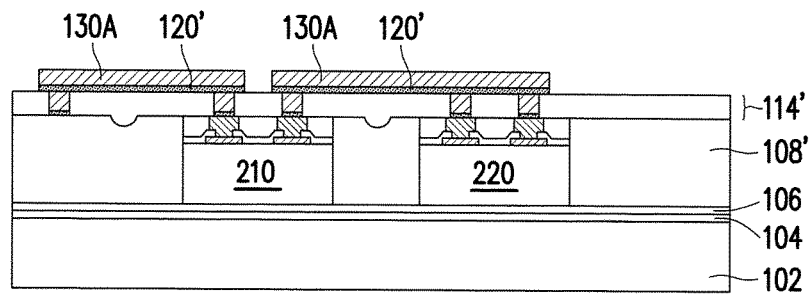

Referring to FIG. 7, after forming the second seed layer 120, a metallization layer 130A may be formed on the second seed layer 120. The metallization layer 130A may for example, be part of a redistribution layer formed in a subsequent step. In some embodiments, the metallization layer 130A may be formed by the following steps. For example, a patterned photoresist (not shown) is provided on the second seed layer 120, wherein the patterned photoresist has openings exposing surfaces of the second seed layer 120. Subsequently, the metallization layer 130A is formed within the openings to cover the exposed surfaces of the second seed layer 120. In a next step, the patterned photoresist and portions of the second seed layer 120 below the patterned photoresist may be removed to form the patterned second seed layer 120'. That is, the second seed layer 120 below the metallization layer 130A is retained, while other portions of the second seed layer 120 are removed.

Figure 8:
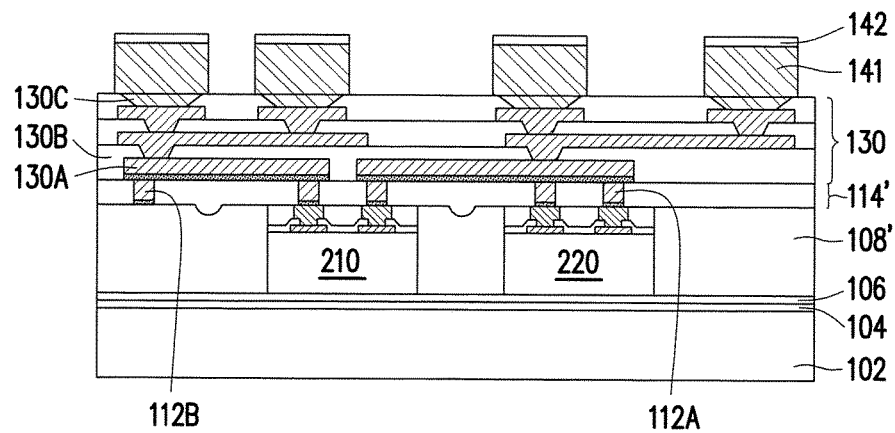

Referring to FIG. 8, the formation of the redistribution layer 130 may be completed by sequentially forming one or more polymer dielectric layers 130B and one or more metallization layers 130A in alternation. In some embodiments, as shown in FIG. 8, the metallization layers 130A are sandwiched between the polymer dielectric layers 130B. In certain embodiments, the redistribution layer 130 is formed over the insulating layer 114', wherein the redistribution layer 130 is electrically connected to the first and second semiconductor dies 210 and 220 through the plurality of conductive pillars 112A. In some embodiments, the material of the metallization layers 130A includes aluminum, titanium, copper, nickel, tungsten, and/or alloys thereof, and the metallization layers 130A may be formed by electroplating or deposition. In some embodiments, the material of the polymer dielectric layers 130B includes polyimide, epoxy resin, acrylic resin, phenol resin, benzocyclobutene (BCB), polybenzooxazole (PBO), or any other suitable polymer-based dielectric material. Although only three layers of the metallization layers 130A and three layers of polymer dielectric layers 130B are illustrated herein, however, the scope of the disclose is not limited by the embodiments of the disclosure.

After forming the polymer dielectric layers 130B and the metallization layers 130A, a plurality of bonding pads 130C is formed on the exposed top surface of the topmost layer of the metallization layers 130A for electrically connecting with conductive elements (e.g. conductive balls/bumps) and/or semiconductor elements (e.g., passive components or active components). In some embodiments, the material of the bonding pads 130C, for example, may include copper, nickel, titanium, tungsten, or alloys thereof or the like, and may be formed by an electroplating process. Subsequently, in some embodiments, conductive elements 141 are formed on the redistribution layer 130. In one embodiment, the conductive elements 141 are formed on the redistribution layer 130 through the bonding pads 130C. In some embodiments, the conductive elements 141 are for example controlled collapse chip connection (C4) bumps. A material of the first conductive elements 141 are for example, tin, silver, copper, nickel, bismuth, zinc, manganese, antimony, indium, cadmium, gold and/or alloys thereof. Furthermore, in some embodiments, a layer of tin 142 may be coated onto the conductive elements 141, and a package 10 of the embodiment is obtained.

In the above embodiments, since a plurality of conductive pillars and dummy pillars are formed on the insulating encapsulant prior to forming the redistribution layer, a collapse issue of the metallization layers in the redistribution layer may be resolved. Furthermore, since the insulating layer is formed to encapsulate the conductive pillars and dummy pillars, and fly cutting or chemical mechanical polishing is preformed to achieve optimal planarization, the formation of the redistribution layer is more stabilized and the collapse of the metallization layers caused by the recesses on the insulating encapsulant is prevented.

In some embodiments of the present disclosure, a package structure including at least one semiconductor die, an insulating encapsulant, an insulating layer, a plurality of conductive pillars, at least one dummy pillar, a first seed layer and a redistribution layer is provided. The at least one semiconductor die have a first surface and a second surface opposite to the first surface. The insulating encapsulant is encapsulating the at least one semiconductor die. The insulating layer is disposed on the first surface of the at least one semiconductor die and on the insulating encapsulant. The plurality of conductive pillars is located on the at least one semiconductor die and inlaid in the insulating layer. The at least one dummy pillar is located on the insulating encapsulant and inlaid in the insulating layer. The first seed layer is embedded in the insulating layer, wherein the first seed layer is located in between the conductive pillars and the at least one semiconductor die, and is located in between the at least one dummy pillar and the insulating encapsulant. The redistribution layer is disposed over the insulating layer, wherein the redistribution layer is electrically connected to the at least one semiconductor die through the conductive pillars.

In another embodiment of the present disclosure, a package structure including a first semiconductor die, an insulating encapsulant, a polymeric insulating layer, a first seed layer, a plurality of conductive pillars, a dummy pillar and a redistribution layer is provided. The first semiconductor die have a first surface and a second surface opposite to the first surface. The insulating encapsulant is encapsulating the first semiconductor die, wherein the insulating encapsulant have an upper surface and a lower surface opposite to the upper surface, and the upper surface of the insulating encapsulant is substantially coplanar with the first surface of the first semiconductor die, and at least one recess is located on the first surface of the insulating encapsulant adjacent to the first surface of the first semiconductor die. The polymeric insulating layer is disposed on the first surface of the first semiconductor die and on the upper surface of the insulating encapsulant, wherein the polymeric insulating layer has at least one protruded portion located in and filling up the at least one recess. The first seed layer is disposed within the polymeric insulating layer, wherein the first seed layer covers portions of the first surface of the first semiconductor die and covers portions of the upper surface of the insulating encapsulant. The plurality of conductive pillars is disposed within the polymeric insulating layer and covering the first seed layer. The dummy pillar is disposed within the polymeric insulating layer and covering the first seed layer. The redistribution layer is disposed over the polymeric insulating layer, wherein the redistribution layer is electrically connected to the first semiconductor die through the plurality of conductive pillars.

In yet another embodiment of the present disclosure, a method of fabricating a package structure is described. The method includes the following steps. At least one semiconductor die is bonded on the carrier, wherein the at least one semiconductor die has a first surface and a second surface opposite to the first surface. An insulating encapsulant is formed to encapsulate the at least one semiconductor die, wherein the insulating encapsulant has an upper surface and a lower surface opposite to the upper surface, and the upper surface of the insulating encapsulant is substantially coplanar with the first surface of the at least one semiconductor die. A patterned first seed layer is formed on the first surface of the at least one semiconductor die and on the insulating encapsulant, and a plurality of conductive pillars is formed on the patterned first seed layer. An insulating layer is formed on the insulating encapsulant and on the at least one semiconductor die, wherein the insulating layer encapsulates the patterned first seed layer and surrounds the plurality of conductive pillars. A redistribution layer is formed over the insulating layer, wherein the redistribution layer is electrically connected to the at least one semiconductor die through the plurality of conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   at least one semiconductor die having a first surface and a second surface opposite to the first surface;
   an insulating encapsulant encapsulating the at least one semiconductor die;
   an insulating layer disposed on the first surface of the at least one semiconductor die and on the insulating encapsulant;
   conductive pillars, located on the at least one semiconductor die and inlaid in the insulating layer;
   at least one dummy pillar, located on the insulating encapsulant and inlaid in the insulating layer;
   a first seed layer embedded in the insulating layer, wherein the first seed layer is located in between the conductive pillars and the at least one semiconductor die, and is located in between the at least one dummy pillar and the insulating encapsulant;
   a redistribution layer disposed over the insulating layer, wherein the redistribution layer is electrically connected to the at least one semiconductor die through the conductive pillars; and
   a second seed layer, disposed on the insulating layer and located in between the conductive pillars and the redistribution layer, wherein the conductive pillars physically separate the first seed layer from the second seed layer.

2. The package structure according to claim 1, wherein each of the conductive pillars and the at least one dummy pillar has a top surface, a bottom surface opposite to the top surface and side surfaces joining the top surface to the bottom surface, and a top width of the top surface is substantially equal to a bottom width of the bottom surface.

3. The package structure according to claim 2, wherein the bottom surfaces of the conductive pillars and the at least one dummy pillar are in contact with the first seed layer, and the bottom width of the bottom surfaces are substantially equal to a width of the first seed layer.

4. The package structure according to claim 2, wherein an angle of the bottom surface relative to the side surfaces of the conductive pillars is 88° to 95°, and an angle of the top surface relative to the side surfaces of the conductive pillars is 88° to 95°, and a shape of the at least one dummy pillar is the same as a shape of the conductive pillars.

5. The package structure according to claim 1, wherein a height of the conductive pillars is in a range from 4 µm to 6 µm, and a height of the at least one dummy pillar is in a range from 4 µm to 6 µm.

6. The package structure according to claim 1, wherein a top surface of the insulating layer is at a position higher than a top surface of the conductive pillars.

7. The package structure according to claim 1, wherein a top surface of the insulating layer is at a position lower than a top surface of the conductive pillars.

8. A package structure, comprising:
   a first semiconductor die having a first surface and a second surface opposite to the first surface;
   an insulating encapsulant encapsulating the first semiconductor die, the insulating encapsulant having an upper surface and a lower surface opposite to the upper surface, wherein the upper surface of the insulating encapsulant is substantially coplanar with the first surface of the first semiconductor die, and has at least one recess adjacent to the first surface of the first semiconductor die;
   a polymeric insulating layer disposed on the first surface of the first semiconductor die and on the upper surface of the insulating encapsulant, wherein the polymeric insulating layer has at least one protruded portion located in and filling up the at least one recess;
   a first seed layer disposed within the polymeric insulating layer, wherein the first seed layer covers portions of the first surface of the first semiconductor die and covers portions of the upper surface of the insulating encapsulant;
   a plurality of conductive pillars, disposed within the polymeric insulating layer and covering the first seed layer;
   a dummy pillar, disposed within the polymeric insulating layer and covering the first seed layer; and
   a redistribution layer disposed over the polymeric insulating layer, wherein the redistribution layer is electrically connected to the first semiconductor die through the plurality of conductive pillars.

9. The package structure according to claim 8, further comprising:
   a second seed layer disposed on the insulating layer and covering the plurality of conductive pillars and the dummy pillar, wherein the plurality of conductive pillars and the dummy pillar are located in between the first seed layer and the second seed layer.

10. The package structure according to claim 8, further comprising:
    a second semiconductor die having a first surface and a second surface opposite to the first surface; and
    the insulating encapsulant further comprises a second recess adjacent to the first surface of the second semiconductor die, and the polymeric insulating layer has a second protruded portion located in and filling up the second recess.

11. The package structure according to claim 8, wherein the plurality of conductive pillars and the dummy pillar each have a top surface, a bottom surface opposite to the top surface, and side surfaces joining the top surface to the bottom surface, and a top width of the top surface is substantially equal to a bottom width of the bottom surface.

12. The package structure according to claim 11, wherein the bottom surfaces of the plurality of conductive pillars and the dummy pillar are in contact with the first seed layer, and the bottom width of the bottom surfaces are substantially equal to a width of the first seed layer.

13. The package structure according to claim 11, wherein an angle of the bottom surface relative to the side surfaces of the plurality of conductive pillars is 88° to 95°, and an angle of the top surface relative to the side surfaces of the plurality of conductive pillars is 88° to 95°, and a shape of the dummy pillar is the same as a shape of the plurality of conductive pillars.

14. The package structure according to claim 8, wherein a height of the plurality of conductive pillars is in a range front 4 µm to 6 µm, and a height of the dummy pillar is in a range from 4 µm to 6 µm.

15. A method of fabricating a package structure, comprising:
    bonding at least one semiconductor die on a carrier, wherein the at least one semiconductor die has a first surface and a second surface opposite to the first surface;
    forming an insulating encapsulant encapsulating the at least one semiconductor die, wherein the insulating encapsulant has an upper surface and a lower surface opposite to the upper surface, and the upper surface of the insulating encapsulant is substantially coplanar with the first surface of the at least one semiconductor die;
    forming a patterned first seed layer on the first surface of the at least one semiconductor die and on the insulating encapsulant and forming a plurality of conductive pillars on the patterned first seed layer;

forming an insulating layer on the insulating encapsulant and on the at least one semiconductor die, wherein the insulating layer encapsulates the patterned first seed layer and surrounds the plurality of conductive pillars;

forming a second seed layer on the insulating layer and covering the plurality of conductive pillars, and the plurality of conductive pillars physically separates the patterned first seed layer from the second seed layer; and forming a redistribution layer over the insulating layer, wherein the redistribution layer is electrically connected to the at least one semiconductor die through the plurality of conductive pillars.

16. The method according to claim 15, wherein the patterned first seed layer and the plurality of conductive pillars are formed by the following steps:

forming a seed layer on the insulating encapsulant;

providing a photoresist pattern on the seed layer, wherein the photoresist pattern has openings exposing surfaces of the seed layer; and forming the plurality of conductive pillars within the openings to cover the exposed surfaces of the seed layer; and removing the photoresist pattern and portions of the seed layer below the photoresist pattern to form the patterned first seed layer.

17. The method according to claim 16, wherein the insulating encapsulant is formed after forming the patterned first seed layer and the plurality of conductive pillars.

18. The method according to claim 1, wherein the plurality of conductive pillars is each formed with a top surface, a bottom surface opposite to the top surface, and side surfaces joining the top surface to the bottom surface, and a top width of the top surface is substantially equal to a bottom width of the bottom surface.

19. The method according to claim 18, wherein an angle of the bottom surface relative to the side surfaces of the plurality of conductive pillars is 88° to 95°, and an angle of the top surface relative to the side surfaces of the plurality of conductive pillars is 88° to 95°.

20. The method according to claim 15, wherein forming the plurality of conductive pillars further comprises forming a dummy pillar on the patterned first seed layer and over the insulating encapsulant, and wherein the insulating layer surrounds the dummy pillar and the redistribution layer covers the dummy pillar.

* * * * *